(12) United States Patent
Chung et al.

(10) Patent No.: US 12,027,628 B2
(45) Date of Patent: *Jul. 2, 2024

(54) SEMICONDUCTOR DEVICE AND METHOD

(71) Applicant: Taiwan Semiconductor Manufacturing Co., Ltd., Hsinchu (TW)

(72) Inventors: Yun-Yan Chung, Hsinchu (TW); Chao-Ching Cheng, Hsinchu (TW); Chao-Hsin Chien, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/303,924

(22) Filed: Apr. 20, 2023

(65) Prior Publication Data
US 2023/0253503 A1 Aug. 10, 2023

Related U.S. Application Data

(63) Continuation of application No. 17/324,893, filed on May 19, 2021, now Pat. No. 11,670,720.
(Continued)

(51) Int. Cl.
*H01L 29/786* (2006.01)
*H01L 21/02* (2006.01)
(Continued)

(52) U.S. Cl.
CPC .. *H01L 29/78645* (2013.01); *H01L 21/02565* (2013.01); *H01L 21/02568* (2013.01);
(Continued)

(58) Field of Classification Search
CPC ......... H01L 21/02565; H01L 21/02568; H01L 21/0262; H01L 21/82345; H01L 29/0657; H01L 29/0692; H01L 29/24; H01L 29/40114; H01L 29/40111; H01L 29/4238; H01L 29/42384; H01L 29/4908;
(Continued)

(56) References Cited

U.S. PATENT DOCUMENTS

2005/0133917 A1 6/2005 Hoffman et al.
2005/0199881 A1 9/2005 Hoffman et al.
(Continued)

FOREIGN PATENT DOCUMENTS

JP 2019161182 A 9/2019
KR 20050061323 A 6/2005
(Continued)

*Primary Examiner* — Cheung Lee
(74) *Attorney, Agent, or Firm* — Slater Matsil, LLP

(57) ABSTRACT

In an embodiment, a method includes forming a first gate electrode over a substrate. The method also includes forming a first gate dielectric layer over the first gate electrode. The method also includes depositing a semiconductor layer over the first gate dielectric layer. The method also includes forming source/drain regions over the first gate dielectric layer and the semiconductor layer, the source/drain regions overlapping ends of the semiconductor layer. The method also includes forming a second gate dielectric layer over the semiconductor layer and the source/drain regions. The method also includes and forming a second gate electrode over the second gate dielectric layer.

20 Claims, 14 Drawing Sheets

Related U.S. Application Data

(60) Provisional application No. 63/134,256, filed on Jan. 6, 2021, provisional application No. 63/118,141, filed on Nov. 25, 2020.

(51) Int. Cl.
  *H01L 29/24* (2006.01)
  *H01L 29/423* (2006.01)
  *H01L 29/66* (2006.01)
  *H01L 29/68* (2006.01)
  *H01L 29/76* (2006.01)

(52) U.S. Cl.
  CPC .......... *H01L 21/0262* (2013.01); *H01L 29/24* (2013.01); *H01L 29/42384* (2013.01); *H01L 29/66484* (2013.01); *H01L 29/66969* (2013.01); *H01L 29/685* (2013.01); *H01L 29/7606* (2013.01); *H01L 29/78648* (2013.01); *H01L 29/78681* (2013.01); *H01L 29/7869* (2013.01); *H01L 29/78696* (2013.01)

(58) Field of Classification Search
  CPC ......... H01L 29/66484; H01L 29/66969; H01L 29/685; H01L 29/7606; H01L 29/778; H01L 29/7831; H01L 29/78645; H01L 29/78648; H01L 29/78681; H01L 29/7869; H01L 29/78696; H01L 29/788
  See application file for complete search history.

(56) References Cited

U.S. PATENT DOCUMENTS

| | | |
|---|---|---|
| 2011/0266542 A1 | 11/2011 | Ryu et al. |
| 2015/0062475 A1 | 3/2015 | Kim et al. |
| 2018/0114839 A1 | 4/2018 | Wu et al. |
| 2019/0019894 A1 | 1/2019 | Okazaki et al. |
| 2019/0103496 A1 | 4/2019 | Colinge et al. |
| 2019/0123149 A1 | 4/2019 | Lee et al. |
| 2022/0077317 A1 | 3/2022 | Yamazaki et al. |
| 2022/0149192 A1 | 5/2022 | Maxey et al. |

FOREIGN PATENT DOCUMENTS

| | | |
|---|---|---|
| KR | 20070003930 A | 1/2007 |
| KR | 20110119963 A | 11/2011 |
| KR | 20170041433 A | 4/2017 |
| KR | 20190045659 A | 5/2019 |
| KR | 20190101343 A | 8/2019 |

SEMICONDUCTOR DEVICE AND METHOD

PRIORITY CLAIM AND CROSS-REFERENCE

This application is a continuation of U.S. patent application Ser. No. 17/324,893, filed May 19, 2021, entitled "Semiconductor Device and Method," which claims the benefit of the U.S. Provisional Application No. 63/134,256, filed on Jan. 6, 2021, and entitled "Switchable NAND and NOR Logic Gate Transistor," it also claims benefit of the U.S. Provisional Application No. 63/118,141, filed on Nov. 25, 2020, entitled "Switchable NAND and NOR Logic Computing in Single Triple-Gate Monolayer Two-Dimensional Material Channel Transistors", both of which applications are hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
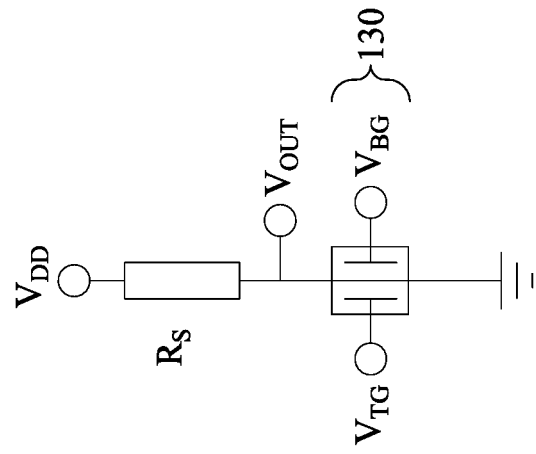
FIGS. 1A and 1B illustrate a cross-sectional view of an intermediate stage in the formation of a double-gate transistor device and a schematic representation of a circuit including a double-gate transistor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include the embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, the present disclosure is a device and method of forming the same to provide a device with a two-dimensional (2-D) material ultra-thin body transistor and logic gate function in a single device. The device design enables switchable NAND and NOR logic computing in a single multiple-gate transistor. The 2-D material layer may be a transition metal dichalcogenide (TMD) material layer. The disclosed embodiments simplify the logic gate layout and area efficiency but also combine the NAND and NOR logic function in single device.

For example, in some embodiments, a double-gate transistor device with a 2-D material layer channel can function as a NAND or NOR logic device with a voltage rematching operation being performed when switching between the NAND and NOR logic functions. In some embodiments, a triple-gate transistor device with a 2-D material layer channel can function as a NAND or NOR logic device with an input to the device selecting between the NAND and NOR logic functions.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 1A:
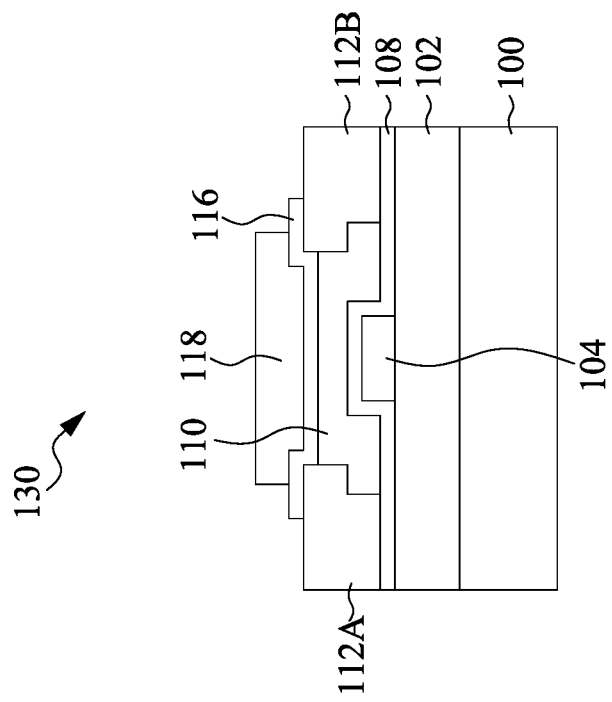

FIGS. 1A and 1B illustrate a cross-sectional view of an intermediate stage in the formation of a double-gate transistor device and a schematic representation of a circuit including a double-gate transistor device. In FIG. 1A, a double-gate transistor device 130 is illustrated at an intermediate stage of formation. The double-gate transistor device 130 includes a channel layer 110 with a top gate electrode 118 and a bottom gate electrode 104 on opposite sides of the channel layer 110 such that the channel layer 110 is between the gate electrodes 118 and 104. The top gate electrode 118 is separated from the channel layer 110 by a top gate dielectric layer 116, and the bottom gate electrode 104 is separated from the channel layer 110 by a bottom gate dielectric layer 108. Source/drain regions 112A and 112B are formed on opposing ends of the channel layer 110 with each of the source/drain regions 112A and 112B overlapping the respective end of the channel layer 110. The gate electrodes 118 and 104, the source/drain regions 112A and 112B, the gate dielectrics 116 and 108, and the channel layer 110 are all formed over a substrate 100. In some embodiments, a dielectric layer 102 is formed on the substrate 100 and separates the structures from the substrate 100.

The top gate electrode 118 and the bottom gate electrode 104 both control whether current flows between source/drain regions 112A and 112B in the channel layer 110. For example, in some embodiments, for current to flow through the channel layer 110 between the source/drain regions 112A and 112B, both of the top and bottom gate electrodes 118 and 104 must have a high ("1") input voltage applied to them. Said another way, for the double-gate transistor device 130 to be considered in an "ON state, both the top and bottom gate electrodes 118 and 104 must have a high ("1") input voltage applied to them. Thus, in these embodiments, if only one of the gates has a high input voltage, then no current (or a very small amount such that the transistor will be considered in an "OFF" state) will flow through the channel layer 110 between the source/drain regions 112A and 112B.

FIG. 1B illustrates a schematic representation of a circuit including the double-gate transistor device 130. As illustrated in FIG. 1B, the device 130 and a load $R_S$ is coupled between a supply voltage $V_{DD}$ and a low voltage, such as ground. In some embodiments, the source/drain region 112A is connected to an output node $V_{OUT}$, and the source/drain region 112B is connected to the low voltage node, such as ground. As discussed above, the top and bottom gate electrodes 118 and 104 control the current flow through the double-gate transistor device 130, and thus, both the top and bottom gate electrodes 118 and 104 control the output $V_{OUT}$.

Figures 2A, 2B:
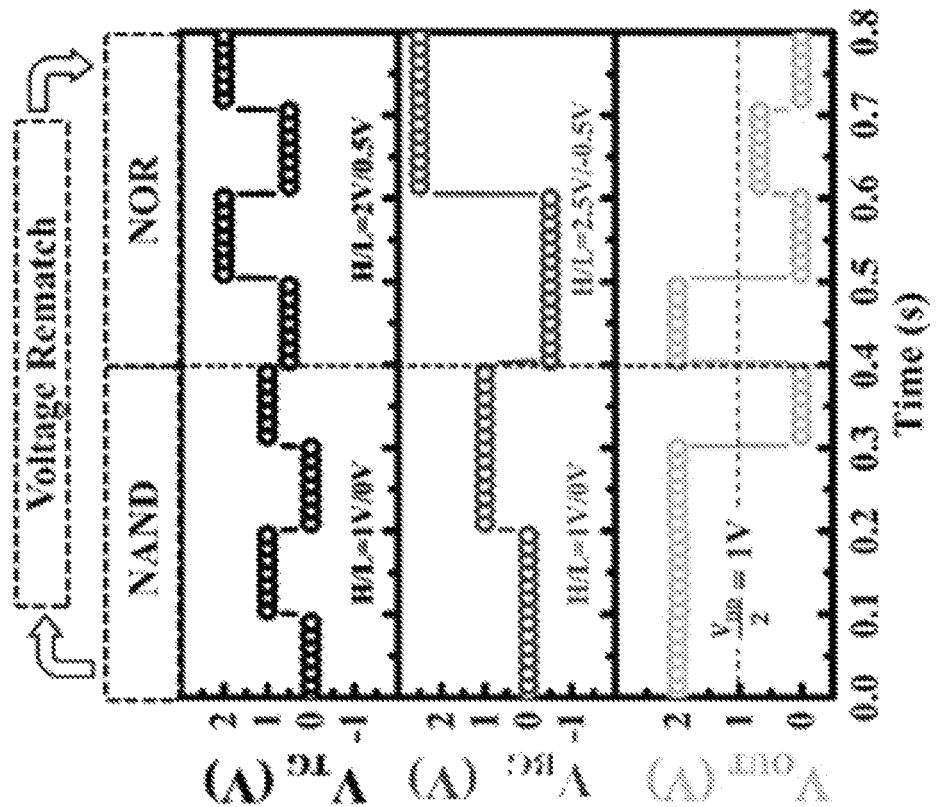
FIGS. 2A and 2B illustrate a truth table and exemplary voltage waveforms for the inputs and outputs of the NAND and NOR logic functions of the double-gate transistor device in FIGS. 1A and 1B in accordance with some embodiments.

FIGS. 2A and 2B illustrate a truth table and exemplary voltage waveforms for the inputs and outputs of the NAND and NOR logic functions of the double-gate transistor device in FIGS. 1A and 1B.

In FIG. 2A, the truth table illustrates that the inputs to the logic functions of the double-gate transistor device 130 are the top gate ($V_{TG}$) and the bottom gate ($V_{BG}$) and the output is the source/drain region 112A ($V_{OUT}$) (see. e.g., FIG. 1B). FIG. 2B illustrates example voltage waveforms for the inputs and output of the double-gate transistor device 130 in a NAND and NOR configuration.

In the illustrated example of the NAND configuration, VDD is 2V and either 0V for a low ("0") input or 1V for a high ("1") input is applied to the inputs $V_{TG}$ and $V_{BG}$. If both $V_{TG}$ and $V_{BG}$ have high inputs (e.g., 1V), then the output $V_{OUT}$ is pulled below the output threshold $V_{DD}/2$ to signify a "0" output. In all other cases in the NAND configuration, the output $V_{OUT}$ is above the output threshold $V_{DD}/2$ to signify a "1" output.

In the illustrated example of the NOR configuration, VDD is 2V, either 0.5V for a low ("0") input or 2V for a high ("1") input is applied to the input $V_{TG}$, and either −0.5V for a low ("0") input or 2.5V for a high ("1") input is applied to the input $V_{BG}$.

Please note that the voltage inputs for the NOR configuration is different than the NAND configuration such that the double-gate transistor device 130 requires a voltage rematch step when switching between the two different configurations. For the NOR configuration, if both $V_{TG}$ and $V_{BG}$ have low inputs (e.g., 0.5V and −0.5V, respectively), then the output $V_{OUT}$ is above the output threshold $V_{DD}/2$ to signify a "1" output. In all other cases in the NOR configuration, the output $V_{OUT}$ is below the output threshold $V_{DD}/2$ to signify a "0" output.

Although specific voltages are illustrated in FIG. 2B, the disclosure is not limited to these specific voltages for the NAND and NOR logic configurations. For example, other voltage levels of $V_{DD}$ and the inputs $V_{TG}$ and $V_{BG}$ could be used.

Figure 3B:
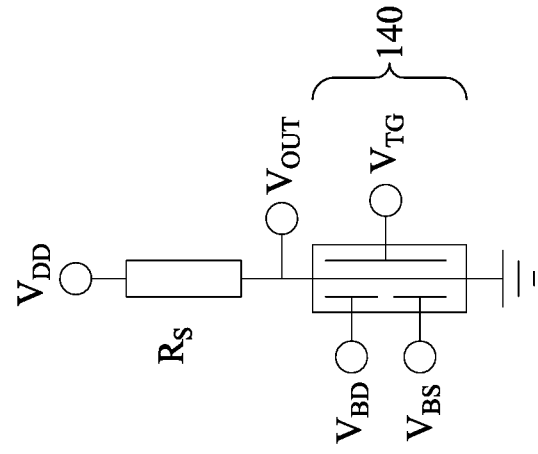
FIGS. 3A and 3B illustrate a cross-sectional view of an intermediate stage in the formation of a triple-gate transistor device and a schematic representation of a circuit including a triple-gate transistor device in accordance with some embodiments.
Figure 3A:
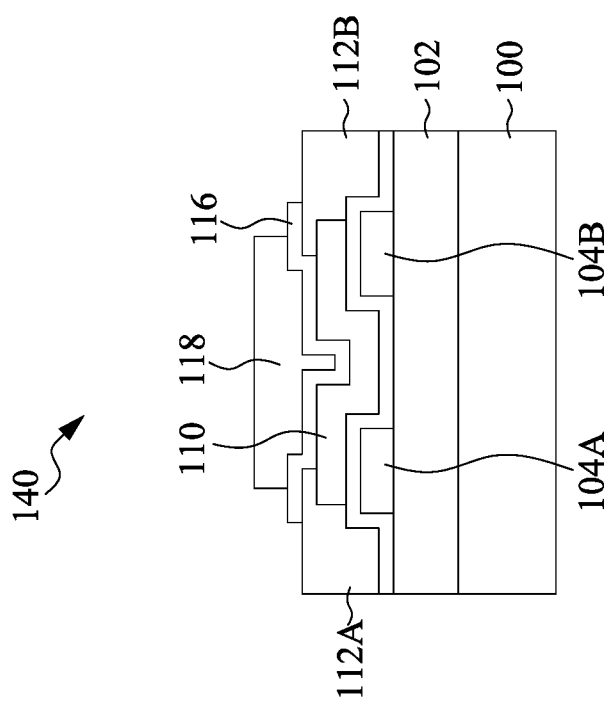

FIGS. 3A and 3B illustrate a cross-sectional view of an intermediate stage in the formation of a triple-gate transistor device 140 and a schematic view including a triple-gate MOSFET device 140. The triple-gate transistor device 140 is similar to the double-gate transistor device 130 in FIGS. 1A and 1B except that the triple-gate transistor device 140 has two bottom gate electrodes 104A and 104B. Details regarding this embodiment that are similar to those for the previously described embodiment will not be repeated herein.

As illustrated in FIG. 3A, the bottom gate electrode 104A is near the source/drain region 112A and the bottom gate electrode is near the source/drain region 112B while the top gate electrode 118 spans the entirety of the area between the source/drain regions 112A and 112B, and thus, is near both source/drain regions 112A and 112B.

The top gate electrode 118 and the bottom gate electrodes 104A and 104B each have a part in controlling whether current flows between source/drain regions 112A and 112B in the channel layer 110. For example, in some embodiments, for current to flow through the channel layer 110 between the source/drain regions 112A and 112B, at least two of the three top and bottom gate electrodes 118, 104A, and 104B must have a high ("1") input voltage applied to them. Said another way, for the triple-gate transistor device 140 to be considered in an "ON state, at least two of the three top and bottom gate electrodes 118, 104A, and 104B must have a high ("1") input voltage applied to them. Thus, in these embodiments, if only one of the gates has a high input voltage, then no current (or a very small amount such that the transistor will be considered in an "OFF" state) will flow through the channel layer 110 between the source/drain regions 112A and 112B.

FIG. 3B illustrates a schematic representation of a circuit including the triple-gate transistor device 140. As illustrated in FIG. 3B, the device 140 and a load $R_S$ is coupled between a supply voltage $V_{DD}$ and a low voltage, such as ground. In some embodiments, the source/drain region 112A is connected to an output node $V_{OUT}$, and the source/drain region 112B is connected to the low voltage node, such as ground. As discussed above, the top and bottom gate electrodes 118, 104A, and 104B control the current flow through the triple-gate transistor device 140, and thus, each of the top and bottom gate electrodes 118, 104A, and 104B have a part in controlling the output $V_{OUT}$.

Figures 4A, 4B:
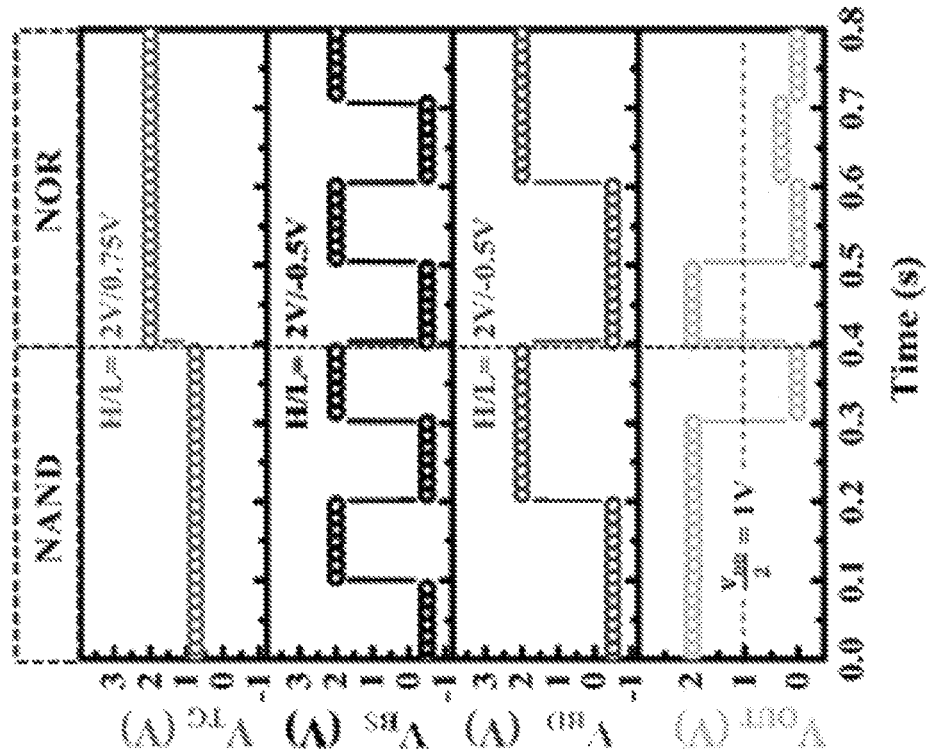
FIGS. 4A and 4B illustrate a truth table and exemplary voltage waveforms for the inputs and outputs of the NAND and NOR logic functions of the triple-gate transistor device in FIGS. 3A and 3B in accordance with some embodiments.

FIGS. 4A and 4B illustrate a truth table and exemplary voltage waveforms for the inputs and outputs of the NAND and NOR logic functions of the triple-gate transistor device 140 in FIGS. 3A and 3B.

In FIG. 4A, the truth table illustrates that the inputs to the logic functions of the triple-gate transistor device 140 are the top gate ($V_{TG}$), the bottom gate electrode 104A ($V_{BD}$), and the bottom gate electrode 104B ($V_{BS}$), and the output is the source/drain region 112A ($V_{OUT}$) (see. e.g., FIG. 3B). FIG. 4B illustrates example voltage waveforms for the inputs and output of the triple-gate transistor device 140 in a NAND and NOR configuration.

In the illustrated example, VDD is 2V, either −0.5V for a low ("0") input or 2V for a high ("1") input is applied to the inputs $V_{BD}$ and $V_{BS}$, and either 0.75V for a low ("0") input or 2V for a high ("1") input is applied to the input $V_{TG}$. In the illustrated example, the input VTG selects if the triple-gate transistor device 140 is in a NAND or NOR configuration. For example, if $V_{TG}$ has a low voltage input (e.g., 0.75V), then the device 140 is in a NAND configuration, and if $V_{TG}$ has a high voltage input (e.g., 2V), then the device 140 is in a NOR configuration. Unlike the double-gate transistor device 130, the triple-gate transistor device 140 does not require a voltage rematch process when switching between NAND and NOR configurations.

In the NAND configuration, if $V_{TG}$ has a low input (e.g., 0.75V) and if both $V_{BS}$ and $V_{BD}$ have high inputs (e.g., 2V), then the output $V_{OUT}$ is pulled below the output threshold $V_{DD}/2$ to signify a "0" output. In all other cases in the NAND configuration, the output $V_{OUT}$ is above the output threshold $V_{DD}/2$ to signify a "1" output.

In the NOR configuration, if $V_{TG}$ has a high input (e.g., 2V) and if both $V_{BS}$ and $V_{BD}$ have low inputs (e.g., −0.5V), then the output $V_{OUT}$ is above the output threshold $V_{DD}/2$ to signify a "10" output. In all other cases in the NOR configuration, the output $V_{OUT}$ is below the output threshold $V_{DD}/2$ to signify a "0" output.

Although specific voltages are illustrated in FIG. 4B, the disclosure is not limited to these specific voltages for the NAND and NOR logic configurations. For example, other voltage levels of $V_{DD}$ and the inputs $V_{TG}$, $V_{BS}$, and $V_{BD}$ could be used.

FIGS. 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate the plan views and cross-sectional views of intermediate stages in the formation of a double-gate transistor device using a two-dimensional material in accordance with some embodiments. These figure numbers are followed by a letter "A," or "B" wherein the letter "B" indicates that the respective view is a plan view (a top view), the letter "A" indicates that the respective figure is obtained from the reference cross-section A-A in the respective plan view. For example, FIG. 5A illustrates the reference cross-section A-A in FIG. 5B.

Figure 5A:
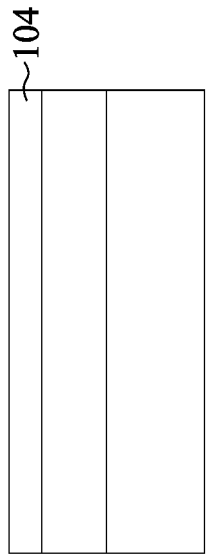
FIGS. 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate the plan views and cross-sectional views of intermediate stages in the formation of a double-gate transistor device using a two-dimensional material in accordance with some embodiments.
Figure 5B:
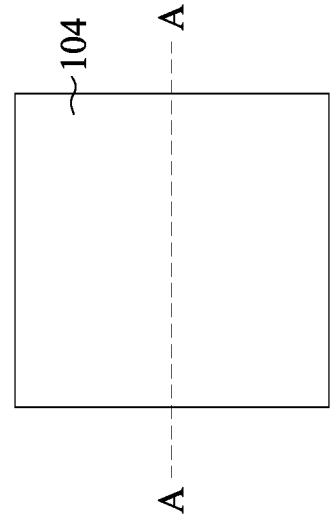

Referring to FIGS. 5A and 5B a substrate 100 is provided. In accordance with some embodiments of the present disclosure, the substrate 100 may be a semiconductor substrate, such as a bulk semiconductor substrate, a Semiconductor-On-Insulator (SOI) substrate, or the like. The substrate 100 may be doped (e.g., with a p-type or an n-type dopant) or undoped. The substrate 100 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of substrate 100 may include silicon; germanium; a compound semiconductor including carbon-doped silicon, gallium arsenic, gallium phosphide, indium phosphide, indium arsenide, and/or indium antimonide; an alloy semiconductor including SiGe, carbon-doped silicon, GaAsP, AlInAs, AlGaAs, GaInAs, GaInP, and/or GaInAsP; or combinations thereof.

Isolation layer 102 is formed over substrate 100. In accordance with some embodiments of the present disclosure, the isolation layer 102 is in physical contact with substrate 100. In accordance with alternative embodiments of the present disclosure, between the isolation layer 102 and substrate 100, there may be other layers and devices including, and not limited to, dielectric layers, metal features, or the like. For example, there may be inter-layer dielectrics, inter-metal dielectrics (which may include low-k dielectric layers), and/or the like. There may be, or may not be, integrated circuit devices such as passive devices (capacitors, resistors, inductors, or the like) and/or active devices (transistors, diodes, or the like) formed between the isolation layer 102 and the substrate 100.

In accordance with some embodiments of the present disclosure, the isolation layer 102 is formed of or comprises a nitride such as silicon nitride, an oxide such as silicon oxide, silicon oxy-fluoride (SiOF), silicon oxy-carbide (SiOC), or the like, or a high-k dielectric material such as aluminum oxide, hafnium oxide, zirconium oxide, lanthanum oxide, or the like. The isolation layer 102 may be a crystalline layer (single crystalline or polycrystalline) or an amorphous layer. The isolation layer 102 may have a single-layer structure or a composite structure including a plurality of layers. For example, the isolation layer 102 may include a bi-layer structure, a tri-layer structure, or the like. The bi-layer structure may include two layers formed of different materials, for example, a silicon oxide layer and a silicon nitride layer over the silicon oxide layer. In accordance with some embodiments of the present disclosure, the thickness of the isolation layer 102 is in the range between about 5 nm and about 20 nm.

The formation process of the isolation layer 102 may include one or a plurality of deposition process(es) including, for example, a Plasma Enhanced Chemical Vapor Deposition (PECVD) process, a Plasma Enhanced Atomic Layer Deposition (PEALD) process, an Atomic Layer Deposition (ALD) process, a Chemical Vapor Deposition (CVD) process, or the like. In accordance with some embodiments of the present disclosure, the isolation layer 102 may also be formed through thermal oxidation, chemical oxidation, or the like, for example, when the isolation layer 102 comprises silicon oxide and when substrate 100 is formed of or comprises silicon.

Figure 6A:
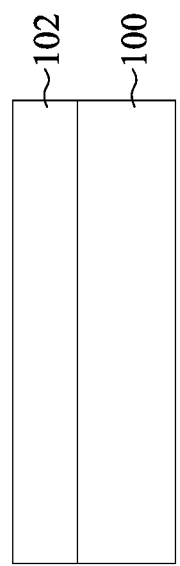
Figure 6B:
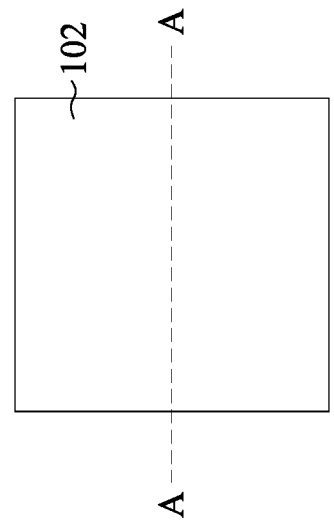

In FIGS. 6A and 6B, a conductive layer 104 is formed over the isolation layer 102 and the substrate 100. The conductive layer 104 is subsequently patterned to form a bottom gate electrode 104 (see, e.g., FIGS. 9A-B). The conductive layer 104 may include a metal-containing material such as TiN, TiO, TaN, TaC, Co, Ru, Al, W, combinations thereof, or multi-layers thereof. For example, although a single conductive layer 104 is illustrated in FIG. 6A-B, the conductive layer 104 may comprise any number of seed layers, liner layers, any number of work function tuning layers. The conductive layer 104 may be deposited by physical vapor deposition (PVD), CVD, sputter deposition, plating, or other techniques known and used in the art for depositing conductive materials. After the forming of the conductive layer 104, a planarization process, such as a CMP, may be performed to planarize a top surface of the conductive layer 104.

Figure 7A:
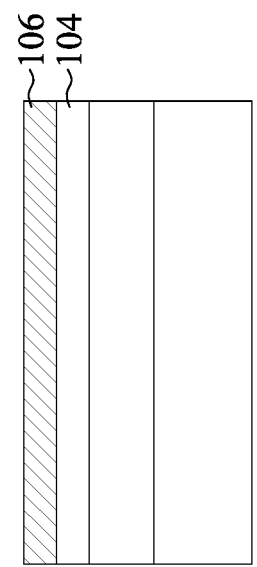
Figure 7B:
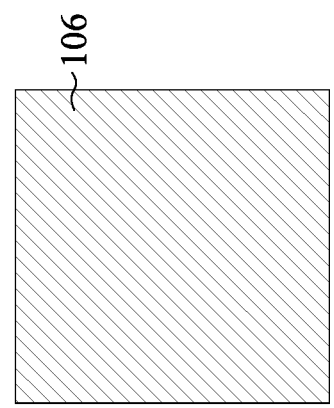

In FIGS. 7A and 7B, a mask layer 106 is formed over the conductive layer 104. The mask layer 106 is subsequently patterned and will be used to pattern the conductive layer 104. The mask layer 106 may include, for example, $SiO_x$, SiN, SiON, the like, or a combination thereof. The mask layer 106 may be deposited by any suitable method, such as CVD, plasma-enhanced CVD (PECVD), or the like. In some embodiments, the mask layer 106 is a photo resist.

Figure 8A:
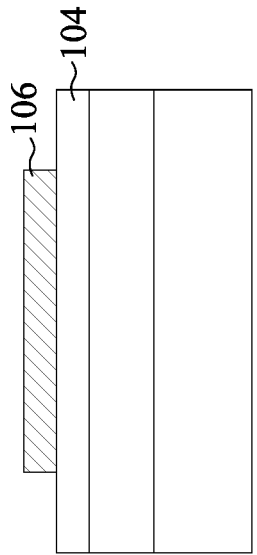
Figure 8B:
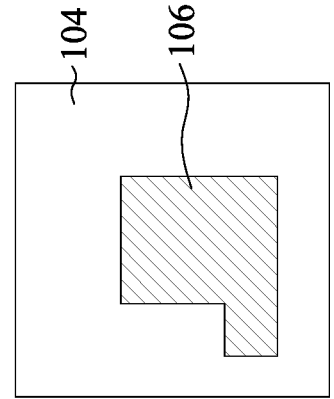

In FIGS. 8A and 8B, the mask layer 106 is patterned over the conductive layer 104 corresponding to the location of the bottom gate electrode 104. The mask layer 106 is patterned using acceptable photolithography and etching techniques to form a patterned mask 106. The pattern of the mask 106 then may be transferred to the conductive layer 104 (see FIGS. 9A-B).

Figure 9A:
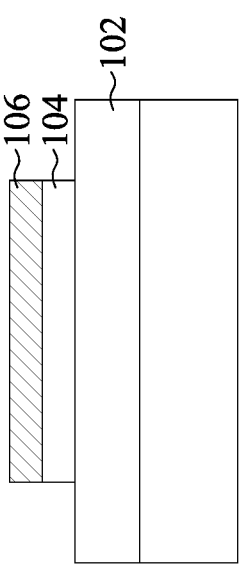
Figure 9B:
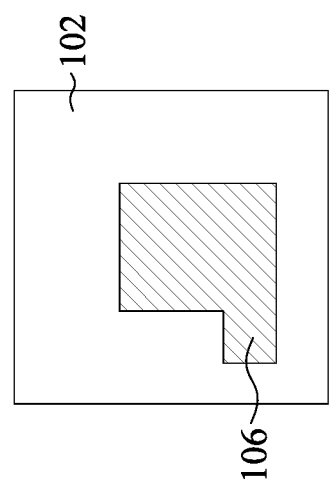

In FIGS. 9A and 9B, the patterned mask 106 is then used to pattern the conductive layer 104 to form a bottom gate electrode 104. After the mask is patterned, the exposed portions of the conductive layer 104 (e.g., portions of the conductive layer 104 not under the mask) are removed, such as by using an acceptable etching process, such as by wet or dry etching. The remaining portions of the conductive layer 104 form the bottom gate electrode 104. In this embodiment, the bottom gate electrode may have sidewalls that are sloped (e.g., sidewalls that widen) from a top surface of the bottom gate electrode 104 to the bottom surface of the bottom gate electrode 104. The sloped sidewalls of the bottom gate electrode 104 mean that in some embodiments, the bottom gate electrode 104 has a larger bottom surface than a top surface. In some embodiments, the sidewalls of the bottom gate electrode 104 are not sloped and are perpendicular to a major surface of the substrate 100.

Figure 10A:
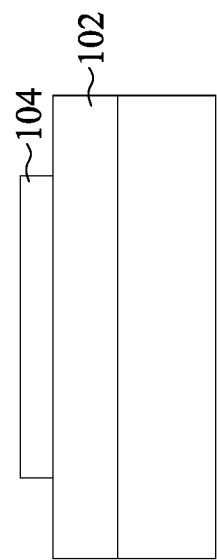
Figure 10B:
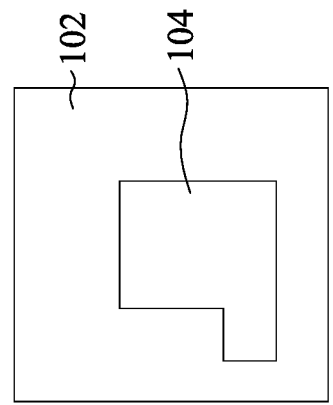

In FIGS. 10A and 10B, the patterned mask 106 is removed to expose a top surface of the bottom gate electrode 104. In some embodiments, the patterned mask 106 is removed with an etch process, a planarization process, such as a CMP, the like or a combination thereof. In some embodiments, the patterned mask 106 is removed during the patterning of the conductive layer 104, and a separate etch process to remove the patterned mask 106 is not needed.

Figure 11A:
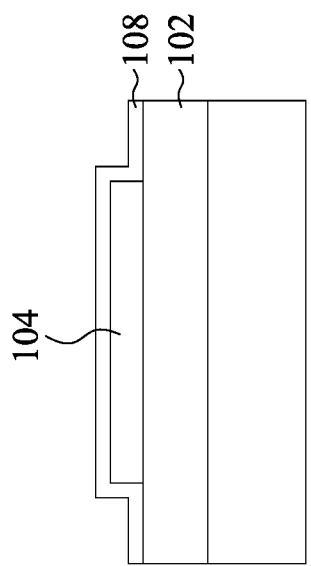
Figure 11B:

In FIGS. 11A and 11B, a bottom gate dielectric layer 108 is formed. The bottom gate dielectric layer 108 and bottom gate electrode 104 may be referred to as a bottom gate stack. The bottom gate dielectric layer 108 is formed to cover a top surface and sidewalls of the bottom gate electrode 104. In accordance with some embodiments, the bottom gate dielectric layer 108 comprise silicon oxide, silicon nitride, or multilayers thereof. In some embodiments, the bottom gate dielectric layer 108 include a high-k dielectric material, and in these embodiments, the bottom gate dielectric layer 108 may have a k value greater than about 7.0, and may include a metal oxide or a silicate of Hf, Al, Zr, La, Mg, Ba, Ti, Pb, and combinations thereof. The formation methods of the bottom gate dielectric layer 108 may include Molecular-Beam Deposition (MBD), ALD, PECVD, and the like. For example, the bottom gate dielectric layer 108 may include a silicon oxide layer and a high-k dielectric layer over the silicon oxide layer.

Figure 12A:
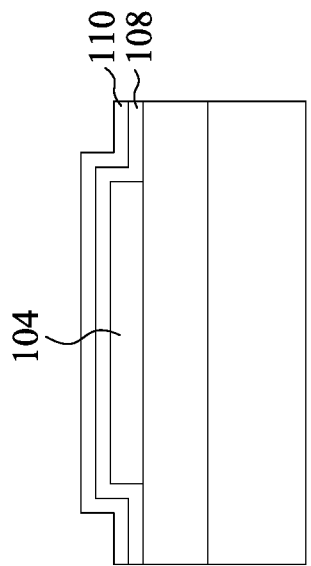
Figure 12B:
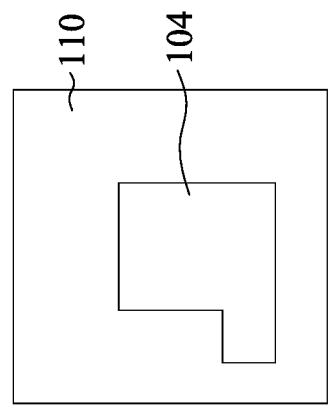

In FIGS. 12A and 12B, a semiconductor layer 110 is formed through deposition. The semiconductor layer 110 will be used as a channel layer or active layer in the subsequently formed transistor. In some embodiments, the semiconductor layer 110 covers a top surface and sidewalls of the bottom gate dielectric layer 108. In accordance with some embodiments of the present disclosure, the semiconductor layer 110 is formed of a 2D material, which is also referred to as a Van Der Waals material. The 2D material includes one or a plurality of monolayers. Strong bonds such as covalence bonds are formed within the monolayers to bond the atoms in the same monolayer to each other. The bonding force between neighboring monolayers is Van Der Waals force, which is a weak force.

In some embodiments, the semiconductor layer 110 may be formed of or comprise $MoS_2$, $MoSe_2$, $WS_2$, $WSe_2$, InSe, or the like. In some embodiments, the semiconductor layer 110 is a semiconductor oxide and may include zinc oxide, indium gallium zinc oxide (IGZO), or the like.

In accordance with some embodiments of the present disclosure, semiconductor layer 28 is formed of or comprises a Transition Metal Dichalcogenide (TMD) material, which comprises the compound of a transition metal and a group-VIA element. The transition metal may include W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like.

As illustrated in FIGS. 12A and 12B, in some embodiments of the present disclosure, the semiconductor layer 110 is a conformal layer, with a thickness of vertical portions and a thickness of the horizontal portions close to each other, for example, with a difference smaller than about 20 percent (or 10 percent or smaller) of either of thicknesses. In accordance with some embodiments of the present disclosure, the semiconductor layer 110 is deposited using CVD, with $MoO_3$ powder and sulfur (s) (or Se) powder as precursors, and nitrogen ($N_2$) as a carrier gas. The flow rate of each of the $MoO_3$ powder and Se powder may be in the range between about 5 sccm and about 100 sccm. In accordance with alternative embodiments of the present disclosure, PECVD or another applicable method is used. The deposition temperature may be between about 750° C. and about 1,000° C. in accordance with some embodiments of the present disclosure, and higher or lower temperatures may be used. The deposition duration may be in the range between about 10 minutes and about 1 hour. The process conditions are controlled to achieve the desirable total count of monolayers. In accordance with some embodiments of the present disclosure, semiconductor layer 28 includes between 1 (a single monolayer) and about 4 monolayers, while more monolayers maybe formed. Correspondingly, the thickness of the semiconductor layer 110 may be in the range between about 0.7 nm (corresponding to a single monolayer) and about 3 nm (corresponding to four monolayers).

However, the processes as described above are intended to be illustrative only and are not intended to be limiting upon the embodiments. Rather, any suitable process of forming or placing the semiconductor layer 110 onto the bottom gate dielectric layer 108 may be utilized. For example, a CVD process using precursors such as $MoO_3$ and $H_2S$, or precursors such as Mo and $H_2S$, may also be utilized. In some embodiments, a physical vapor deposition PVD process which utilizes a $MoS_2$ target may be utilized. Additionally, any other suitable processes, such as dissociation of spin-on coated $(NH_4)_2MoS_4$, or growing the semiconductor layer 110 on a substrate such as copper, nickel, or sapphire and then transferring the semiconductor layer 110 to the bottom gate dielectric layer 108, may be used.

In some embodiments, the TMD material for the semiconductor layer 110 may be formed in bulk separately from the substrate 100 and then a layer of the bulk semiconductor layer material is removed and placed onto the bottom gate dielectric layer 108. For example, a mechanical exfoliation using, e.g., a Scotch-type tape may be utilized to remove a layer or layers of TMD materials from a bulk TMD material and then the TMD material may be transferred to the bottom gate dielectric layer 108 to form the semiconductor layer 110. In some embodiments, a liquid exfoliation of the TMD materials from the bulk TMD material using, e.g., an intercalation such as n-butyl lithium dissolved in hexane may be utilized to remove the semiconductor layer 110 for transport to the bottom gate dielectric layer 108. Any suitable method of forming or placing the semiconductor layer 110 may be used, and all such methods are fully intended to be included within the scope of the embodiments.

Figure 13A:
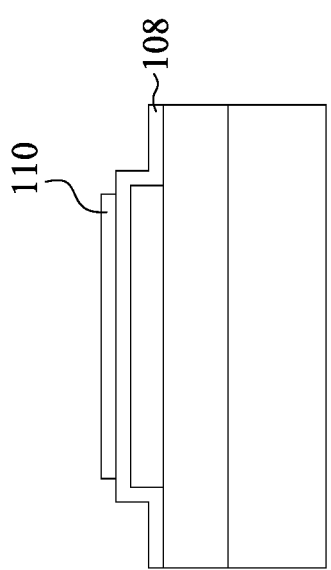
Figure 13B:
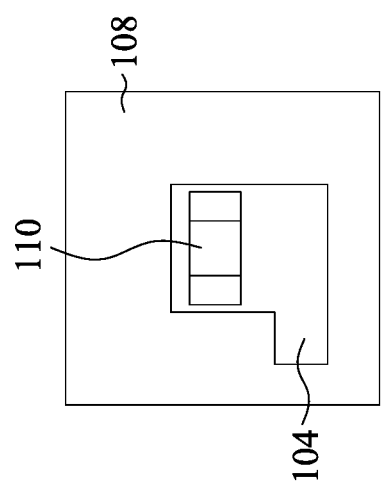

In FIGS. 13A and 13B, the semiconductor layer 110 is patterned. The semiconductor layer 110 is patterned to define the active area of the subsequently formed transistor (see, e.g., FIGS. 18A-B). In some embodiments, after the patterning process, the bottom gate electrode 104 is wider than the semiconductor layer 110 in the direction of current flow between the subsequently formed source/drain regions 112 (see FIGS. 14A and 14B). The patterning may be achieved using a photoresist or other masks (not shown) and one or more etching processes. For example, a photoresist may be formed over the semiconductor layer 110. The photoresist is patterned to expose the portion of the semiconductor layer 110 to be removed. The photoresist can be formed by using a spin-on technique and can be patterned using acceptable photolithography techniques. Once the photoresist is patterned, an etching process is performed on the semiconductor layer 110, and the photoresist may act as a mask to prevent the desired semiconductor layer 110 from being removed. After the one or more etching processes, the photoresist is removed, such as by an acceptable ashing process.

Figure 14A:
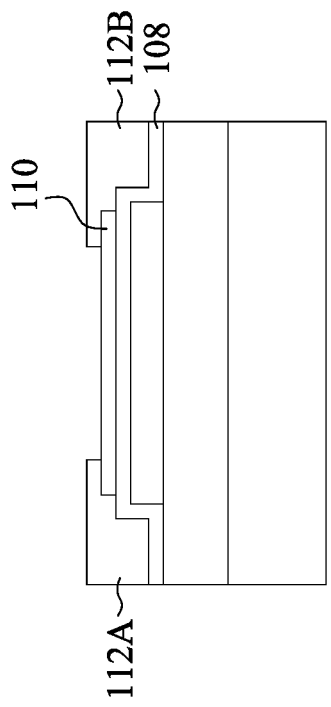
Figure 14B:
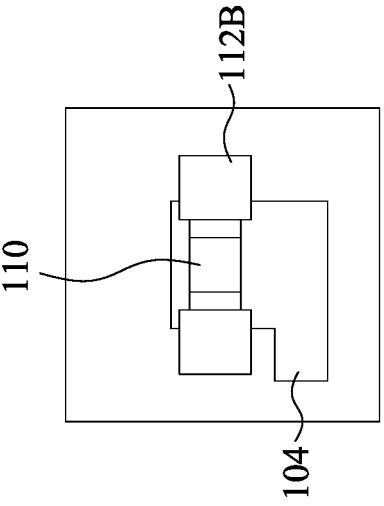

In FIGS. 14A and 14B, the source/drain regions 112 (112A and 112B) are formed over the semiconductor layer 110 and the bottom gate dielectric layer 108. In the illustrated embodiment, the source/drain regions 112 are formed on the bottom gate dielectric layer 108 and the semiconductor layer 110. The source/drain regions 112 overlap ends of the patterned semiconductor layer 110 which acts as a channel layer for the subsequently formed transistor and a portion of the semiconductor layer 110 is exposed between the overlapped ends of the source/drain regions 112. The source/drain regions 112 may be formed by PVD, CVD, sputter deposition, plating, such as electroplating or electroless plating, or other techniques known and used in the art for depositing conductive material. The conductive material may include a metal-containing material such as TiN, TiO, TaN, TaC, Co, Ru, Al, W, Ni, Ti, Ni, Bi, Sb, Sn combinations thereof, or multi-layers thereof. For example, although a single conductive layer 104 is illustrated in FIG. 14A-B, the source/drain regions 112 may comprise more than one layer of conductive material.

As an example to form the source/drain regions 112 with a plating process, a photo resist is then formed and patterned over the semiconductor layer 110 and the bottom gate dielectric layer 108. The photo resist may be formed by spin coating or the like and may be exposed to light for patterning. The pattern of the photo resist corresponds to the source/drain regions 112. The patterning forms openings through the photo resist to expose the areas of the semiconductor layer 110 where the source/drain regions 112 are to overlap and contact the semiconductor layer 110. A seed layer (not shown) is formed over the photoresist and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A conductive material is formed on the seed layer in the openings of the photo resist. The conductive material may be formed by plating, such as electroplating or electroless plating, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the thermal pads 182. In the embodiment, where the thermal pads 182 are formed differently, more photo resist and patterning steps may be utilized.

Figure 15A:
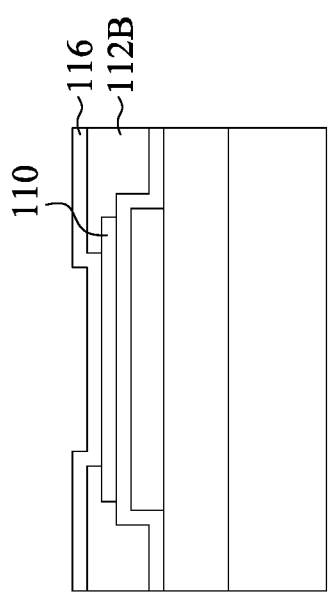
Figure 15B:
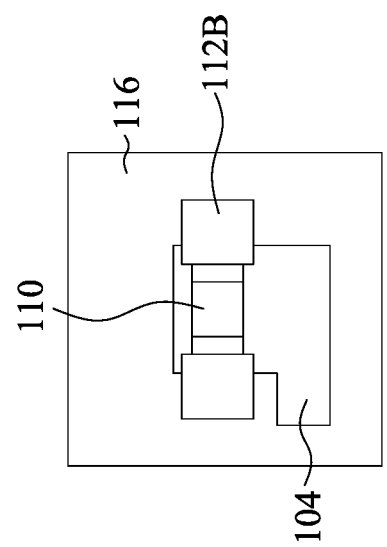

In FIGS. 15A and 15B, a top gate dielectric layer 116 is formed over the source/drain regions 112 and the semiconductor layer 110. The top gate dielectric layer 116 is physically contacting the semiconductor layer 110 between the source/drain regions 112. In accordance with some embodiments, the top gate dielectric layer 116 comprise silicon oxide, silicon nitride, or multilayers thereof. In some embodiments, the top gate dielectric layer 116 include a high-k dielectric material, and in these embodiments, the top gate dielectric layer 116 may have a k value greater than about 7.0, and may include a metal oxide or a silicate of Hf, Al, Zr, La, Mg, Ba, Ti, Pb, and combinations thereof. The formation methods of the top gate dielectric layer 116 may include MBD, ALD, PECVD, and the like. For example, the top gate dielectric layer 116 may include a silicon oxide layer and a high-k dielectric layer over the silicon oxide layer.

The top gate dielectric layer 116 can have a same or different material composition as the bottom gate dielectric layer 108. The top gate dielectric layer 116 can have a same or different thickness as the bottom gate dielectric layer 108. For example, in some embodiments, the top gate dielectric layer 116 has a same material composition and a same thickness as the bottom gate dielectric layer 108.

Figure 16A:
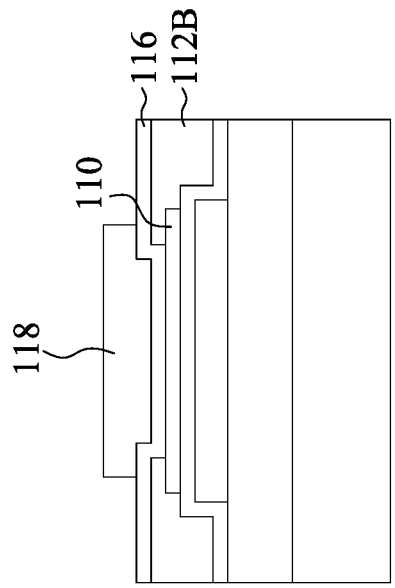
Figure 16B:
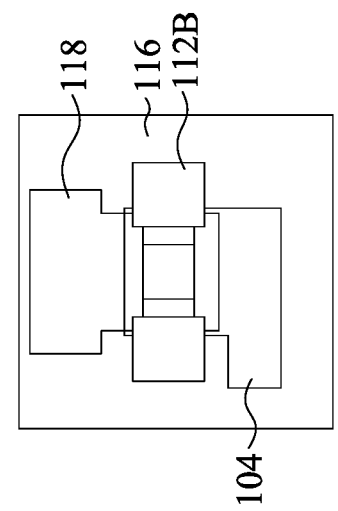

In FIGS. 16A and 16B, a top gate electrode 118 is formed over the isolation top gate dielectric layer 116 between the source/drain regions 112. The top gate dielectric layer 116 and top gate electrode 118 may be referred to as a top gate stack. The top gate electrode 118 may be formed of similar materials and with similar processes as the bottom gate electrode 104 and/or the source/drain regions 112. Although a single layer is illustrated for the top gate electrode 118 in FIG. 16A-B, the top gate electrode 118 may comprise any number of seed layers, liner layers, any number of work function tuning layers. The top gate electrode 118 can have a same or different material composition as the bottom gate electrode 104. The top gate electrode 118 can have a same or different thickness as the bottom gate electrode 104. For example, in some embodiments, the top gate electrode 118 has a same material composition and a same thickness as the bottom gate electrode 104.

Figure 17A:
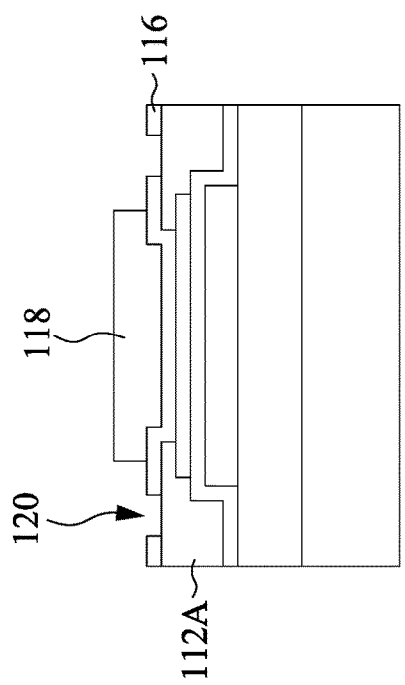
Figure 17B:
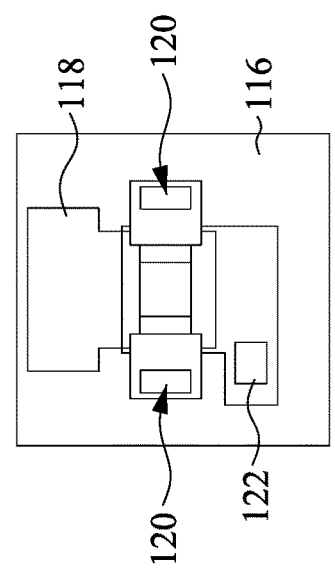

In FIGS. 17A and 17B, the top gate dielectric layer 116 is patterned. The top gate dielectric layer 116 is patterned to form openings 120 to expose portions of the source/drain regions 112 and opening 122 to expose a portion of the bottom gate electrode 104. The openings 120 and 122 may be formed by acceptable photolithography and etching techniques. For example, a photo resist or hard mask may be used as a mask for an etching process. After the mask is patterned, the exposed portions of the top gate dielectric layer 116 (e.g., portions of the top gate dielectric layer 116 not under the mask) are removed, such as by using an acceptable etching process, such as by wet or dry etching to expose portions of the source/drain regions 112 and the bottom gate electrode 104.

Figure 18A:
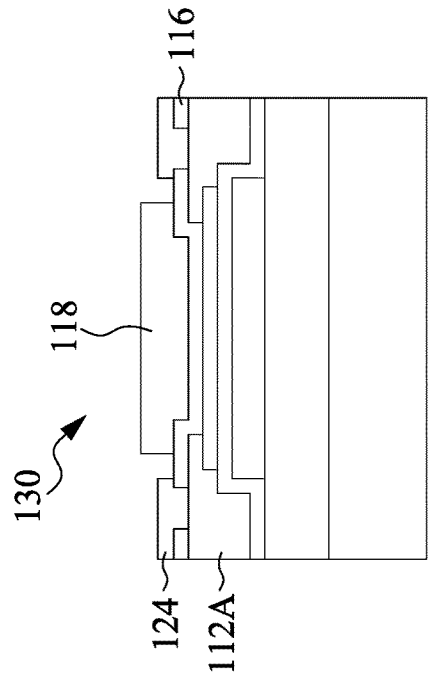
Figure 18B:
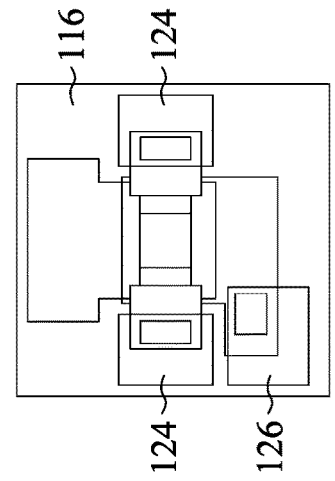

In FIGS. 18A and 18B, source/drain contacts 124 and bottom gate contact 126 is formed in the openings 120 and 122, respectively. After the openings are formed, a liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the top gate dielectric 116. The remaining liner and conductive material form the source/drain contacts 124 and bottom gate contact 126 in the openings. The source/drain contacts 124 are physically and electrically coupled to the source/drain regions 112, and the bottom gate contact 126 is physically and electrically coupled to the bottom gate electrode 104. The source/drain contacts 124 and the bottom gate contact 126 may be formed in different processes, or may be formed in the same process.

Although a single double-gate transistor device 130 is illustrated as being formed on the substrate 100, many double-gate transistor devices 130 may be formed on the same substrate 100 and electrically connected to form circuits.

Although not illustrated, the double-gate transistor device 130 may undergo subsequent processing. For example, an interconnect structure including one or more inter-layer dielectrics, inter-metal dielectrics, conductive vias and conductive lines may be formed over the double-gate transistor device 130.

Figure 19A:
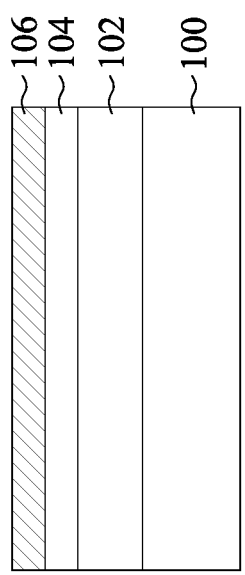

FIGS. 19A, 19B, 20A, 20B, 21A, 21B, 22A, 22B, 23A, and 23B illustrate the plan views and cross-sectional views of intermediate stages in the formation of a triple-gate transistor device 140 using a two-dimensional material in accordance with some embodiments. These figure numbers are followed by a letter "A," or "B" wherein the letter "B" indicates that the respective view is a plan view (a top view), the letter "A" indicates that the respective figure is obtained from the reference cross-section A-A in the respective plan view. For example, FIG. 19A illustrates the reference cross-section A-A in FIG. 19B.

This embodiment is similar to the double-gate transistor device 130 of FIGS. 5A through 18B except that the triple-gate embodiment has two bottom gate electrodes 104A and 104B. Details regarding this embodiment that are similar to those for the previously described embodiment will not be repeated herein.

Figure 19B:
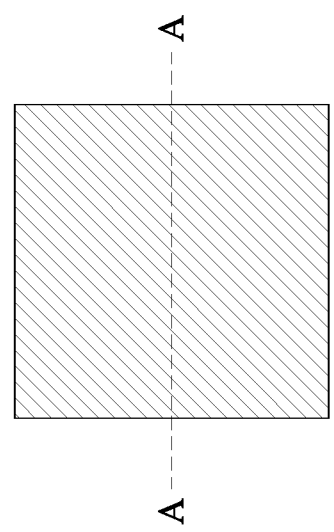

FIGS. 19A and 19B are at a similar stage of processing as FIGS. 7A and 7B and the description of achieving this structure is not repeated herein. FIGS. 19A and 19B illustrate the isolation layer 102 over the substrate 100, the conductive layer 104 over the isolation layer 102, and the mask layer 106 over the conductive layer 104.

Figure 20A:
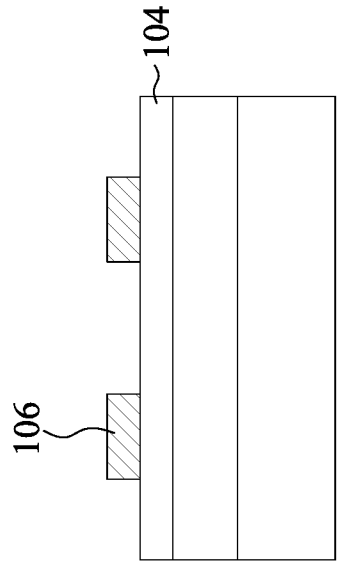
FIGS. 19A, 19B, 20A, 20B, 21A, 21B, 22A, 22B, 23A, and 23B illustrate the plan views and cross-sectional views of intermediate stages in the formation of a triple-gate transistor device using a two-dimensional material in accordance with some embodiments.
Figure 20B:
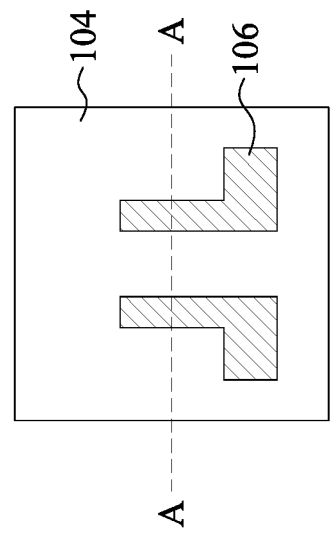

In FIGS. 20A and 20B, the mask layer 106 is patterned over the conductive layer 104 corresponding to the location of the bottom gate electrodes 104A and 104B. The mask layer 106 is patterned using acceptable photolithography and etching techniques to form a patterned mask 106. The pattern of the mask 106 then may be transferred to the conductive layer 104 (see FIGS. 21A-B).

Figure 21A:
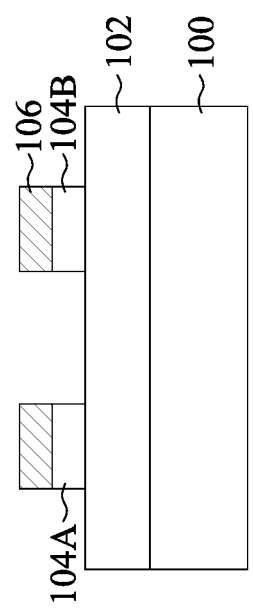
Figure 21B:
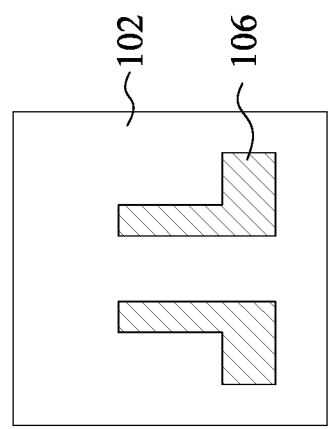

In FIGS. 21A and 21B, the patterned mask 106 is then used to pattern the conductive layer 104 to form a bottom gate electrodes 104A and 104B. After the mask is patterned, the exposed portions of the conductive layer 104 (e.g., portions of the conductive layer 104 not under the mask) are removed, such as by using an acceptable etching process, such as by wet or dry etching. The remaining portions of the conductive layer 104 form the bottom gate electrodes 104A and 104B. In this embodiment, the bottom gate electrodes 104A and 104B may have sidewalls that are sloped (e.g., sidewalls that widen) from a top surface of the bottom gate electrodes 104A and 104B to the bottom surface of the bottom gate electrodes 104A and 104B. The sloped sidewalls of the bottom gate electrodes 104A and 104B mean that in some embodiments, the bottom gate electrodes 104A and 104B have larger bottom surfaces than top surfaces. In some embodiments, the sidewalls of the bottom gate electrodes 104A and 104B are not sloped and are perpendicular to a major surface of the substrate 100.

Figure 22A:
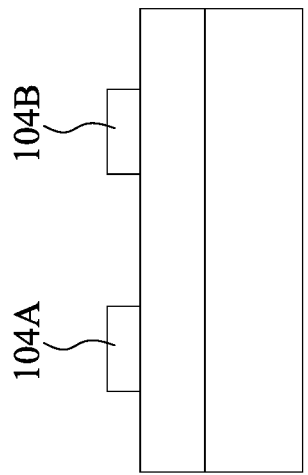
Figure 22B:
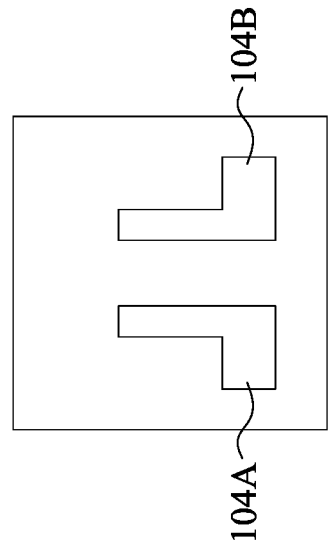

In FIGS. 22A and 22B, the patterned mask 106 is removed to expose a top surface of the bottom gate electrodes 104A and 104B. In some embodiments, the patterned mask 106 is removed with an etch process, a planarization process, such as a CMP, the like or a combination thereof. In some embodiments, the patterned mask 106 is removed during the patterning of the conductive layer 104, and a separate etch process to remove the patterned mask 106 is not needed.

Figure 23A:
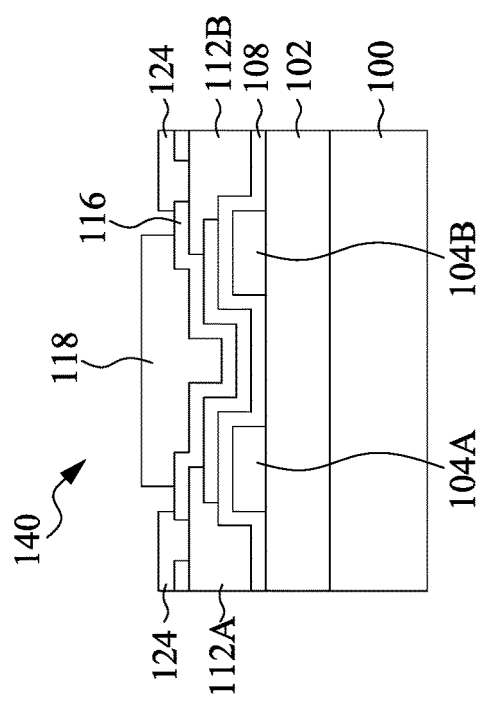
Figure 23B:
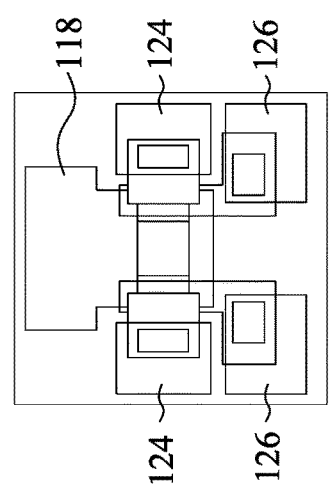

FIGS. 23A and 23B illustrate further processing on the structures of FIGS. 22A and 22B. The processing between these figures is similar to the processing illustrated and described above in reference to FIGS. 10A-B through 18A-B with FIGS. 18A-B being an equivalent intermediate stage as FIGS. 23A-B and the descriptions are not repeated herein.

In FIGS. 23A and 23B, the triple-gate transistor device 140 is illustrated. In the triple-gate transistor device 140 of FIGS. 23A-B, the semiconductor layer 110 extends over top surfaces and inner sidewalls of the bottom gate electrodes 104A and 104B, where the inner sidewalls of the bottom gate electrodes 104A and 104B face each other. In some embodiments, the semiconductor layer has a bottom surface that is lower than top surfaces of both of the bottom gate electrodes 104A and 104B. Further, in some embodiments, the top gate electrode 118 has a bottom surface that is lower than a top surface of the semiconductor layer 110.

In some embodiments, the devices 130 or 140 can be configured to utilize a ferroelectric structure. Specifically, in some embodiments, the bottom gate dielectric layer 108 can be replaced with a ferroelectric layer such that the device can operate as a ferroelectric FET (FeFET) and/or ferroelectric memory. In some embodiments, the ferroelectric structure that replaces bottom gate dielectric layer 108 may be made of hafnium zirconium oxide or the like.

In some embodiments, the devices 130 or 140 can be configured to utilize a floating gate memory structure. Specifically, in some embodiments, the bottom gate dielectric layer 108 can be replaced with a floating gate memory structure such that the device can operate as a floating gate memory. In some embodiments, the floating gate memory structure that replaces bottom gate dielectric layer 108 may be made of a stack of three layers such as aluminum oxide/hafnium oxide/aluminum oxide, silicon oxide/silicon nitride/silicon oxide, or the like. In the embodiments with the ferroelectric structure or the floating gate memory structure, the transistor device's transfer curve can be modulated to create a memory window.

Embodiments may achieve advantages. The present disclosure is a device and method of forming the same to provide a device with a two-dimensional (2-D) material ultra-thin body transistor and logic gate function in a single device. The device design enables switchable NAND and NOR logic computing in a single multiple-gate transistor. The 2-D material layer may be a transition metal dichalcogenide (TMD) material layer. The disclosed embodiments simplify the logic gate layout and area efficiency but also combine the NAND and NOR logic function in single device.

In some embodiments, a double-gate transistor device with a 2-D material layer channel can function as a NAND or NOR logic device with a voltage rematching operation being performed when switching between the NAND and NOR logic functions. In some embodiments, a triple-gate transistor device with a 2-D material layer channel can function as a NAND or NOR logic device with an input to the device selecting between the NAND and NOR logic functions.

In an embodiment, a method includes forming a first gate electrode over a substrate. The method also includes forming a first gate dielectric layer over the first gate electrode. The method also includes depositing a semiconductor layer over the first gate dielectric layer. The method also includes forming source/drain regions over the first gate dielectric layer and the semiconductor layer, the source/drain regions overlapping ends of the semiconductor layer. The method also includes forming a second gate dielectric layer over the semiconductor layer and the source/drain regions. The method also includes and forming a second gate electrode over the second gate dielectric layer.

Embodiments may include one or more of the following features. The method where the depositing the semiconductor layer includes depositing a transition metal dichalcogenide layer. The transition metal dichalcogenide layer includes include MoS2, MoSe2, WS2, WSe2, or InSe. The transition metal dichalcogenide layer is performed using chemical vapor deposition with moo3 powder and sulfur powder as precursors. The depositing the semiconductor layer includes depositing a semiconductor oxide layer. The semiconductor oxide layer includes zinc oxide or indium gallium zinc oxide. The first gate dielectric layer and the second gate dielectric layer each include a high-k dielectric material. The method further including forming an isolation layer over the substrate, the first gate electrode being over the isolation layer. The method further including forming a third gate electrode over the substrate, the first gate dielectric layer and the semiconductor layer being over the third gate electrode, the third gate electrode being spaced apart from the first gate electrode. The semiconductor layer is a conformal layer.

In an embodiment, a device includes a first gate electrode over a substrate. The device also includes a first high-k gate dielectric layer over the first gate electrode. The device also includes a transition metal dichalcogenide layer over the first high-k gate dielectric layer. The device also includes source/drain regions over the first high-k gate dielectric layer and the transition metal dichalcogenide layer, the source/drain regions overlapping ends of the transition metal dichalcogenide layer. The device also includes a second high-k gate dielectric layer over the transition metal dichalcogenide layer and the source/drain regions. The device also includes and a second gate electrode over the second high-k gate dielectric layer.

Embodiments may include one or more of the following features. The device where the transition metal dichalcogenide layer includes a plurality of monolayers. The transition metal dichalcogenide layer includes include MoS2, MoSe2, WS2, WSe2, or InSe. The device further including a third gate electrode over the substrate, the first high-k gate dielectric layer and the transition metal dichalcogenide layer being over the third gate electrode, the third gate electrode being spaced apart from the first gate electrode. The transition metal dichalcogenide layer has a bottom surface lower than top surfaces of the first gate electrode and the third gate electrode. The device is configured to operate as a NAND gate with the first gate electrode and the second gate electrode being inputs to the NAND gate and one of the source/drain regions being an output of the NAND gate. The device is configured to operate as a NOR gate with the first gate electrode and the second gate electrode being inputs to the NOR gate and one of the source/drain regions being an output of the NOR gate.

In an embodiment, a device includes a dielectric layer. The device also includes a first gate electrode over the dielectric layer. The device also includes a first gate dielectric layer over and contacting a top surface and sidewalls of the first gate electrode. The device also includes a two-dimensional semiconductor material over and contacting a top surface and sidewalls of the first gate dielectric layer. The device also includes a source region over and contacting a first end of the two-dimensional semiconductor material, and further contacting the first gate dielectric layer. The device also includes a drain region over and contacting a second end of the two-dimensional semiconductor material, and further contacting the first gate dielectric layer, the second end being an opposite end from the first end. The device also includes a second gate dielectric layer over and contacting top surfaces of the two-dimensional semiconductor material, the source region, and the drain region. The device also includes a second gate electrode over the second gate dielectric layer. The device also includes and source/drain contacts extending through the second gate dielectric layer and contacting the source region and the drain region.

Embodiments may include one or more of the following features. The device further including a third gate electrode over the dielectric layer, the first gate dielectric layer over and contacting a top surface and sidewalls of the third gate electrode, the third gate electrode being spaced apart from the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first gate electrode over a substrate;
   a second gate electrode over the substrate;
   a first gate dielectric layer on top surfaces and sidewalls of the first gate electrode and the second gate electrode;
   a semiconductor layer over the first gate dielectric layer, the semiconductor layer having a bottom surface lower than top surfaces of the first and second gate electrodes;
   source/drain regions over the first gate dielectric layer and the semiconductor layer, the source/drain regions being over ends of the semiconductor layer;
   a second gate dielectric layer over the semiconductor layer and the source/drain regions; and
   a third gate electrode over the second gate dielectric layer.

2. The device of claim 1, wherein the semiconductor layer comprises a transition metal dichalcogenide layer.

3. The device of claim 2, wherein the transition metal dichalcogenide layer comprises $MoS_2$, $MoSe_2$, $WS_2$, $WSe_2$, or InSe.

4. The device of claim 1, wherein bottom surfaces of the first and second gate electrodes are coplanar.

5. The device of claim 1, further comprising:
   a dielectric layer between the substrate and the first and second gate electrodes.

6. The device of claim 1, wherein the semiconductor layer comprises a semiconductor oxide layer.

7. The device of claim 6, wherein the semiconductor oxide layer comprises zinc oxide or indium gallium zinc oxide.

8. The device of claim 1, wherein the device is configured to operate as a NOR gate with the first gate electrode and the second gate electrode being inputs to the NOR gate and one of the source/drain regions being an output of the NOR gate.

9. The device of claim 1, wherein the device is configured to operate as a NAND gate with the first gate electrode and the second gate electrode being inputs to the NAND gate and one of the source/drain regions being an output of the NAND gate.

10. A device comprising:
    a first gate electrode over a substrate;
    a second gate electrode over the substrate;
    a first gate dielectric layer on top surfaces and sidewalls of the first gate electrode and the second gate electrode;
    a semiconductor layer over the first gate dielectric layer;
    source/drain regions over the first gate dielectric layer and the semiconductor layer, the source/drain regions being over ends of the semiconductor layer;
    a second gate dielectric layer over the semiconductor layer and the source/drain regions; and
    a third gate electrode over the second gate dielectric layer, the third gate electrode having a bottom surface lower than a top surface of the semiconductor layer.

11. The device of claim 10, wherein the semiconductor layer comprises a transition metal dichalcogenide layer.

12. The device of claim 11, wherein the transition metal dichalcogenide layer comprises $MoS_2$, $MoSe_2$, $WS_2$, $WSe_2$, or InSe.

13. The device of claim 10, wherein the semiconductor layer comprises a semiconductor oxide layer.

14. The device of claim 13, wherein the semiconductor oxide layer comprises zinc oxide or indium gallium zinc oxide.

15. The device of claim 10, wherein the semiconductor layer is a conformal layer.

16. The device of claim 10, wherein the semiconductor layer has a bottom surface lower than a top surface of the first gate electrode.

17. A method comprising:
    forming an isolation layer over a substrate;
    forming a first gate electrode over the isolation layer;
    forming a second gate electrode over the isolation layer, the second gate electrode being spaced apart from the first gate electrode;
    forming a first high-k gate dielectric layer on top surfaces and sidewalls of the first gate electrode and the second gate electrode;
    depositing a transition metal dichalcogenide layer over the first high-k gate dielectric layer;
    forming source/drain regions over the first high-k gate dielectric layer and the transition metal dichalcogenide layer, the source/drain regions being on ends of the transition metal dichalcogenide layer;
    forming a second high-k gate dielectric layer over the transition metal dichalcogenide layer and the source/drain regions; and
    forming a third gate electrode over the second high-k gate dielectric layer, the transition metal dichalcogenide layer having a bottom surface lower than top surfaces of the first and second gate electrodes.

18. The method of claim 17, wherein depositing the transition metal dichalcogenide layer comprises performing a chemical vapor deposition with $MoO_3$ powder and sulfur powder as precursors.

19. The method of claim 17, wherein the third gate electrode has a bottom surface lower than a top surface of the transition metal dichalcogenide layer.

20. The method of claim 17, wherein bottom surfaces of the first and second gate electrode are coplanar.

* * * * *